United States Patent [19]
Lee

[11] Patent Number: 5,706,172
[45] Date of Patent: Jan. 6, 1998

[54] STACKED SEMICONDUCTOR PACKAGE HAVING SUPPORTING BARS AND A SOCKET THEREFOR

[75] Inventor: Kyu Jin Lee, Seoul, Rep. of Korea

[73] Assignee: Samsung Electronics Co., Ltd., Kyungki-do, Rep. of Korea

[21] Appl. No.: 554,900

[22] Filed: Nov. 9, 1995

[30] Foreign Application Priority Data

Aug. 16, 1995 [KR] Rep. of Korea ............... 1995-25175

[51] Int. Cl.⁶ ........................ H05K 1/00; H01L 27/00
[52] U.S. Cl. ................ 361/735; 361/704; 257/686; 257/668; 257/685; 257/353; 257/724; 439/69
[58] Field of Search ........................ 361/704, 735; 257/686, 668, 685, 353, 724; 439/69

[56] References Cited

U.S. PATENT DOCUMENTS

| 4,398,235 | 8/1983 | Lutz et al. | 361/735 |
| 4,956,694 | 9/1990 | Eide | 257/686 |
| 5,138,438 | 8/1992 | Masayuki et al. | 257/686 |
| 5,247,423 | 9/1993 | Lin et al. | 361/719 |
| 5,343,075 | 8/1994 | Nishino | 257/686 |
| 5,481,133 | 1/1996 | Hsu | 257/621 |
| 5,602,420 | 2/1997 | Ogata et al. | 257/686 |
| 5,613,033 | 3/1997 | Swamy et al. | 361/790 |

FOREIGN PATENT DOCUMENTS 60-133744  7/1985  Japan .

*Primary Examiner*—Leo P. Picard
*Assistant Examiner*—David Foster
*Attorney, Agent, or Firm*—Cushman Darby & Cushman IP Group of Pillsbury Madison & Sutro LLP

[57] ABSTRACT

A stacked semiconductor package including a plurality of semiconductor devices stacked over one another and having outer leads, which are extended from sides of the devices and bent downwardly. A plurality of supports are vertically interposed between the outer leads. The supports electrically connect the outer leads in vertical direction only.

12 Claims, 4 Drawing Sheets

005,706,172

STACKED SEMICONDUCTOR PACKAGE HAVING SUPPORTING BARS AND A SOCKET THEREFOR

BACKGROUND OF THE INVENTION

1. Field of the Invention

The present invention relates generally to a stacked semiconductor package, and in particular to a stacked semiconductor package in which the stacked devices are interconnected by supporting bars.

2. Description of the Prior Art

A stacked semiconductor package is one approach to increase the number of semiconductor devices mounted on a substrate such as a printed circuit substrate. In particular, for memory boards, leads as input/output terminals are interconnected in parallel to increase memory capacity. For this purpose, two or more identical devices are stacked over one another, or semiconductor dice and circuitry on a lead frame except the outer portions of the lead frame are encapsulated by encapsulating material in a mold forming a single package body for the entire module.

The former stacked package requires a special means for interconnecting the respective ones of the outer leads of each stage device, these outer leads having similar electrical functions and being positioned such that they are aligned to each other.

For example, U.S. Pat. No. 5,247,423 discloses electrical interconnections between a plurality of devices (12), (14) stacked over one another, by way of solder balls (8) as shown in FIG. 1 of the present application. As can be seen from FIG. 1, metal conductors (4) which serve as external leads are electrically connected to the semiconductor chip (2), which is mounted on a substrate (10), through bonding wires, and are also electrically connected via holes (6), solder ball pads (5), and solder balls (8), thereby providing an interconnection between the devices (12) can be attained to provide a stacked package (14).

FIG. 2 shows another approach disclosed in JP 60-133744A. For this type of multichip package, semiconductor devices, which are not mounted on a substrate, are stacked by soldering the outer leads of each of the devices. As shown in FIG. 2, the outer leads (26, 28) of each semiconductor device are each provided with an engagement recess (20) at the root thereof. Stacking is performed by inserting the outer leads (26) of higher stage packages (22) into the recesses (20) of the lower stage packages (24) and then soldering the engagement parts.

However, these conventional stacked packages have drawbacks, in that their fabrications require an additional process steps and installations, which cause an increase in production cost as well as a decrease in operation efficiency. For example, since the package shown in FIG. 1 requires the same number of substrates as the number of devices to be mounted, and solder balls, the number of steps of overall process increases, and the strength of the solder joints can be degenerated. Further, the package shown in FIG. 2 requires specially shaped outer leads (26), (28) having engagement recesses (20) at the roots thereof. Moreover, when the number of pins of each package increases, the outer leads become correspondingly thinner and it becomes difficult to form recesses at the roots thereof and the outer leads are more liable to be broken even by slight external shocks.

SUMMARY OF THE INVENTION

Accordingly, an object of the present invention is to provide a stacked semiconductor package, which can be fabricated without altering the shapes of the conventional package devices, and by using conventional equipment.

This object can be accomplished by a stacked semiconductor package comprising

- a plurality of semiconductor devices stacked over one another and having outer leads, which are extended from sides of the devices and bent downwardly; and
- a plurality of supporting means vertically interposed between the outer leads, the supporting means electrically connecting the outer leads in vertical direction only.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and in which.

DETAILED DESCRIPTION OF PREFERRED EMBODIMENTS OF THE INVENTION

Figure 1:
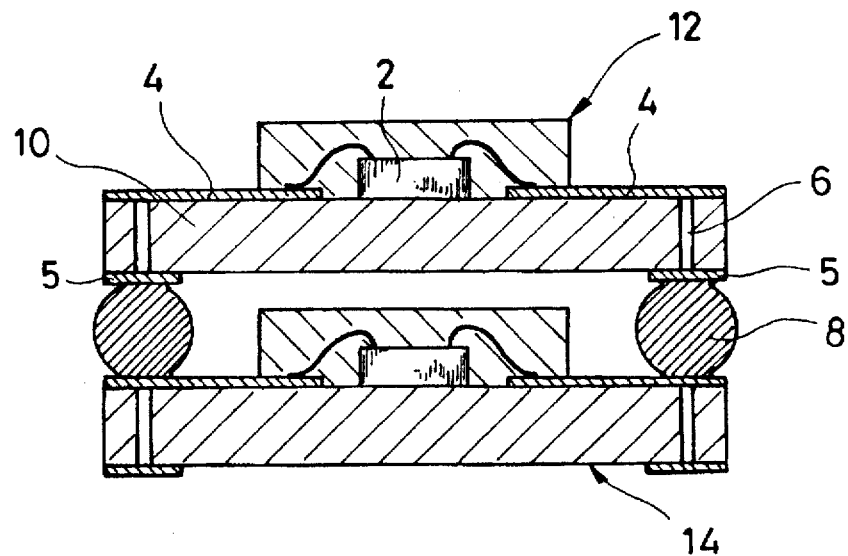
FIG. 1 is one example of conventional stacked multichip packages, in which the stage devices are electrically connected by bumps formed therebetween.
Figure 2:
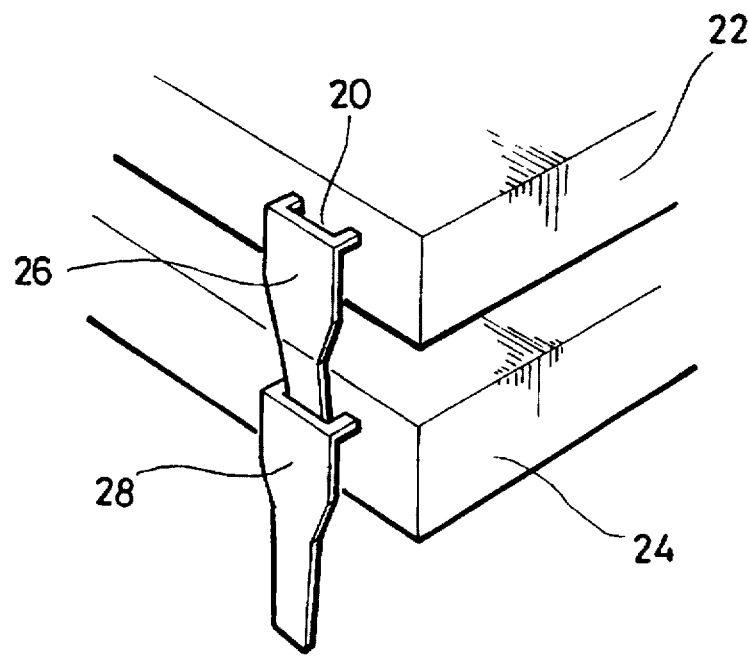
FIG. 2 is another example of conventional stacked multichip packages, in which outer leads each having an engagement recess are employed to electrically connect each stage semiconductor device.
Figure 3:
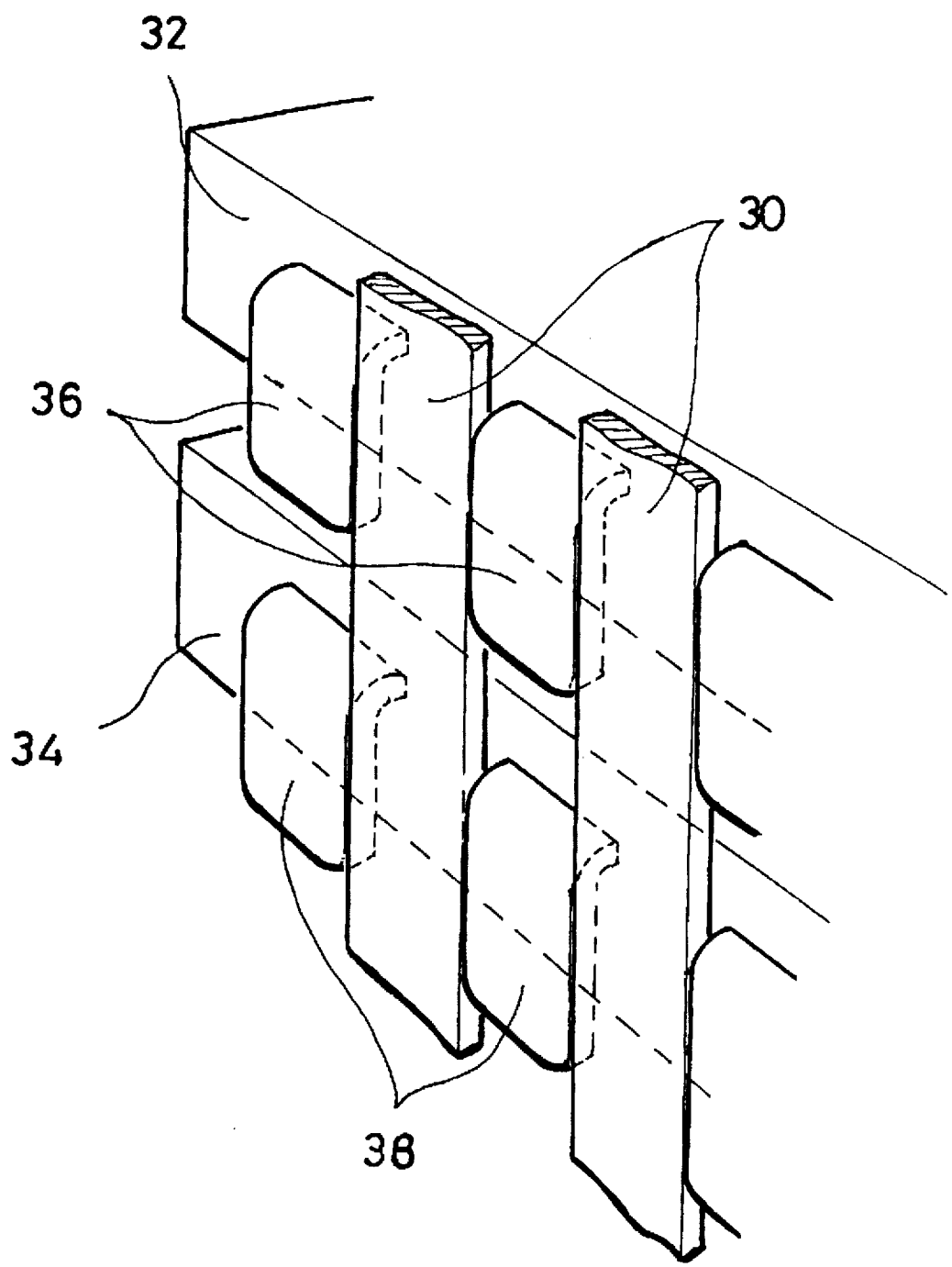
FIG. 3 is a partial perspective view of a stacked multichip package, in which each stage device is electrically connected through supporting bars according to the present invention.

FIG. 3 shows one embodiment of multichip package having a plurality of semiconductor devices stacked over one another according to the present invention. With reference with FIG. 3, semiconductor devices (34) (32) with a plurality of outer leads (38) (36), which are extended from sides of the devices and bent downwardly, are stacked over one another and a plurality of supporting means, for example supporting bars (30) are vertically interposed between the outer leads.

The supporting bars (30) electrically interconnect the outer leads in only in the vertical direction, and mechanically support the frame of the package. Thus, the outer leads of each higher stage package are electrically connected to correspondingly aligned outer leads of each respective next lower stage package by way of supporting bars, which will be described below in more detail.

Figure 4A:
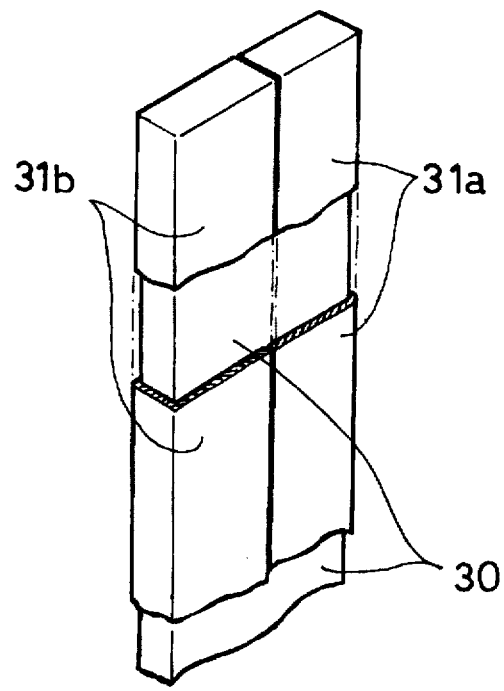
FIG. 4A is a cross-sectional perspective view of one embodiment of supporting bar according to the present invention.
Figure 4B:
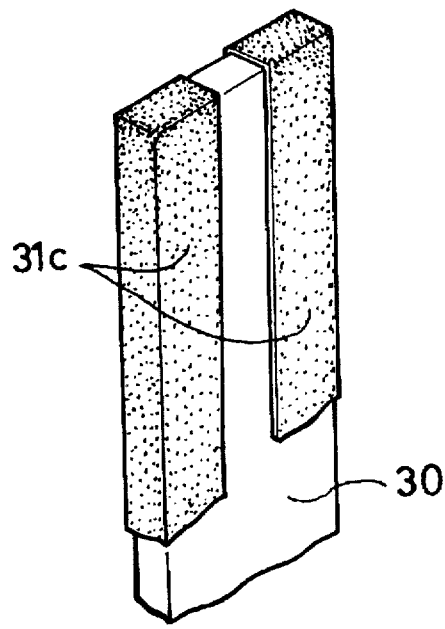
FIGS. 4B and 4C are perspective views of other embodiments of supporting bar according to the present invention.
Figure 4C:
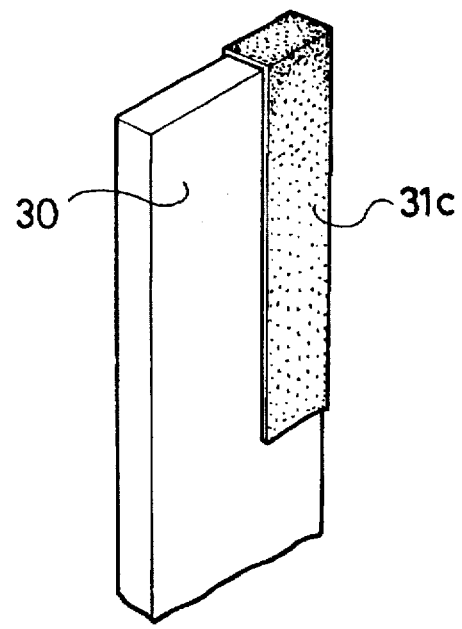

In order to interconnect the outer leads of each stage package in the vertical direction only, the supporting bars may have any of the structures shown in FIGS. 4A through 4C. The supporting bar (30) may be made of conductive (FIG. 4A) or non-conductive materials (FIGS. 4B, 4C), of which examples are well known to those of ordinary skill in the art.

When a supporting bar provided in accordance with principles of the present invention is made of conductive materials, half of it is coated with an insulating material (31a) and the other half is plated (31b) with lead (Pb), as shown in FIG. 4A. Alternatively, when the supporting bar is made of non-conductive material, one or both side ends thereof are plated (31c) with a conductive metal and then lead (Pb), in turn, as shown in FIG. 4B and FIG. 4C.

The conductive metal used to plate one or both side ends of non-conductive supporting bar may be any one of, but not limited thereto, copper, aluminum, gold, and ferrous-nickel alloy.

After interposing the supporting bars between columns of outer leads of stacked packages, a solder reflow process is performed to electrically vertically connect the respective ones of the outer leads which are positioned over one other, as well as to connect the supporting bars to the outer leads.

According to the present invention, since the supporting bar for electrically connecting the stage electronic devices as well as supporting the frame of whole package has a simple structure and can be easily manufactured, a plurality of electronic devices can be easily stacked using conventional equipment in a simple way.

Figure 5:
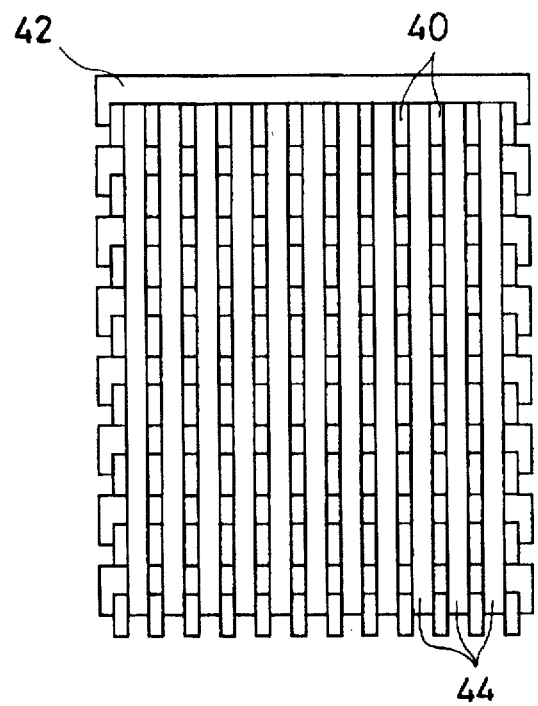
FIG. 5 shows a stacked semiconductor package having supporting bars according to the present invention.

FIG. 5 shows a semiconductor package in which a plurality of, for example eight chips are stacked using the supporting bars according to the present invention. With reference to FIG. 5, the supporting bars (44) electrically mutually connect each stage chip (42) by connecting vertically aligned outer leads (40), as well as provide a mechanical support to the whole package.

Figure 6:
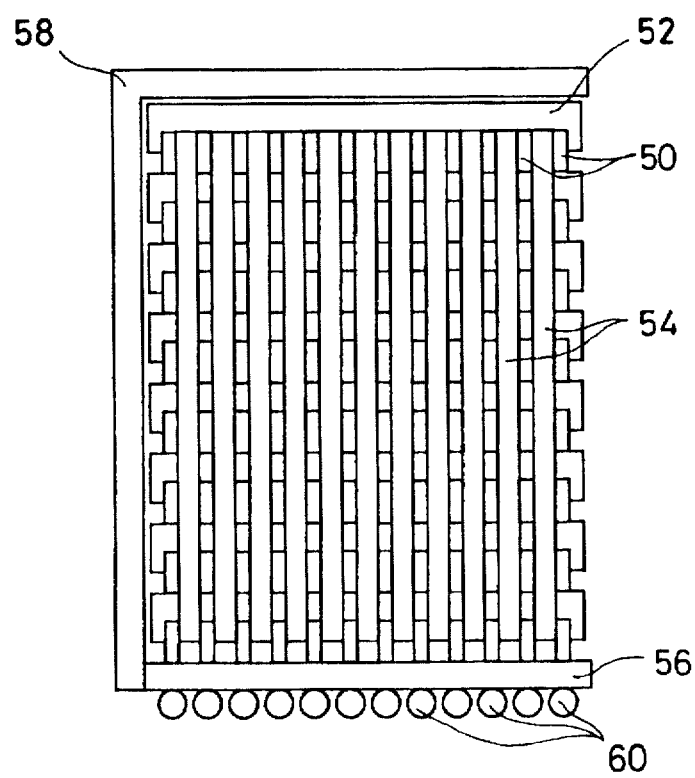
FIG. 6 shows a stacked semiconductor package socket having supporting bars according to the present invention.

FIG. 6 shows a semiconductor package socket prepared by using the supporting bars according to the present invention. This package socket may be simply prepared by mutually connecting package leads (50) of lower stacked package (52) and of higher stacked package (52) by using supporting bars (54) as described above. Then, the stacked package is placed in a socket substrate (56) formed with a circuit pattern, socket lid (58) is put on, and a reflow process is performed. The thus-prepared package socket can be electrically connected to external electric devices by way of leads or balls (60) formed beneath the socket substrate (56).

As described above, the present invention can provide various stacked multichip packages including, but not limited to, SOJ, SOP, PLCC, QFP, TSOP and TQFP, which can be easily fabricated by using the supporting bars according to the present invention, without need for a new installation or additional operations.

Although preferred embodiments of the present invention have been described in detail hereinabove, it should be clearly understood that many variations and/or modifications of the basic inventive concepts herein taught which my appear to those skilled in the art will still fall within the spirit and scope of the present invention as defined in the appended claims.

What is claimed is:

1. A stacked three-dimensional semiconductor package, comprising:

a plurality of semiconductor devices having sides, said semiconductor devices being stacked over one another as a stack and each having a plurality of outer leads, which are extended from said sides of respective ones of said devices and bent downwardly so a to form a plurality of vertical columns thereof distributed about the periphery of said stack; and a plurality of support bars vertically interposed between said columns of said outer leads, each of said support bars electrically connecting the outer leads in only a respective same said column thereof;

each of said being made of a conductive material, a first vertically extensive portion thereof being coated with an insulating material, and a second vertically extensive portion thereof being plated with lead (Pb) arranged to provide said electrically connecting of respective ones of said outer leads in a respective said column.

2. A stacked three-dimensional semiconductor package, comprising:

a plurality of semiconductor devices having sides, said semiconductor devices being stacked over one another as a stack and each having a plurality of outer leads, which are extended from said sides of respective ones of said devices and bent downwardly so a to form a plurality of vertical columns thereof distributed about the periphery of said stack; and a plurality of support bars vertically interposed between said columns of said outer leads, each of said support bars electrically connecting the outer leads in only a respective same said column thereof;

each of said support bars being made of a non-conductive material, a vertically extensive portion thereof being plated with a conductive metal and with lead (Pb), in turn and arranged to provide said electrically connecting of respective ones of said outer leads in a respective said column.

3. A stacked three-dimensional semiconductor package, comprising:

a plurality of semiconductor devices having sides, said semiconductor devices being stacked over one another as a stack and each having a plurality of outer leads, which are extended from said sides of respective ones of said devices and bent downwardly so a to form a plurality of vertical columns thereof distributed about the periphery of said stack; and a plurality of support bars vertically interposed between said columns of said outer leads, each of said support bars electrically connecting the outer leads in only a respective same said column thereof;

each of said support bars being made of a non-conductive material, and two laterally spaced vertically extensive portions thereof each being plated with a conductive metal and with lead (Pb), in turn and being respectively arranged to provide said electrically connecting of respective ones of said outer leads in respective ones of said columns.

4. The package of claim 2, wherein said conductive metal is one selected from the group consisting of copper, aluminum, gold and ferrous-nickel alloy.

5. The package of claim 3, wherein said conductive metal is one selected from the group consisting of copper, aluminum, gold and ferrous-nickel alloy.

6. A stacked package socket comprising a plurality of semiconductor devices stacked over one another and having outer leads, which are extended from sides of said devices and bent downwardly; a circuit substrate formed with a circuit pattern; and a socket lid, said semiconductor devices being stacked by way of a plurality of supporting means, which vertically interposed between said outer leads, and electrically connect the outer leads in vertical direction only.

7. The package of claim 6, wherein said supporting means is made of a conductive material, and half side thereof is coated with an insulating material and the other half side is plated with lead (Pb).

8. The package of claim 6, wherein said supporting means is made of a non-conductive material, and one side end thereof is plated with a conductive metal and with lead (Pb) in turn.

9. The package of claim 6, wherein said supporting means is made of a non-conductive material, and both side ends thereof is plated with a conductive metal and with lead (Pb) in turn.

10. The package of claim 9, wherein said conductive metal is one selected from the group consisting of copper, aluminum, gold and ferrous-nickel alloy.

11. The package of claim 9, wherein said conductive metal is one selected from the group consisting of copper, aluminum, gold and ferrous-nickel alloy.

12. A stacked three-dimensional semiconductor package, comprising:

a plurality of semiconductor devices having sides, said semiconductor devices being stacked over one another as a stack and each having a plurality of outer leads, which are extended from said sides of respective ones of said devices and bent downwardly so as to form a plurality of vertical columns thereof distributed about the periphery of said stack; and a plurality of support bars vertically interposed between columns of said outer leads, each of said support bars electrically connecting the outer leads in only a respective same said column thereof.

* * * * *